(12) United States Patent
Yanduru et al.

(10) Patent No.: US 7,680,477 B2
(45) Date of Patent: Mar. 16, 2010

(54) INTEGRATED RADIO FREQUENCY FILTERS FOR MULTIBAND TRANSCEIVERS

(75) Inventors: Naveen Yanduru, Richardson, TX (US); Gregory Howard, Plano, TX (US); Srinivasan Venkatraman, Lowell, MA (US); Danielle Griffith, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 495 days.

(21) Appl. No.: 11/041,548

(22) Filed: Jan. 24, 2005

(65) Prior Publication Data

US 2006/0063493 A1 Mar. 23, 2006

Related U.S. Application Data

(60) Provisional application No. 60/607,085, filed on Sep. 3, 2004.

(51) Int. Cl.
*H04B 1/16* (2006.01)
*H04M 1/00* (2006.01)

(52) U.S. Cl. .......... 455/340; 455/286; 455/552.1; 455/553.1

(58) Field of Classification Search ........... 455/552.1, 455/553.1, 339, 340, 178.1, 286
See application file for complete search history.

(56) References Cited

U.S. PATENT DOCUMENTS

| | | | | |
|---|---|---|---|---|
| 4,662,001 A | * | 4/1987 | Cruz et al. | 455/340 |
| 4,760,535 A | * | 7/1988 | Englmeier | 702/107 |
| 4,835,608 A | * | 5/1989 | Lachiw et al. | 348/733 |
| 4,905,306 A | * | 2/1990 | Anderson | 455/191.3 |
| 5,280,638 A | * | 1/1994 | Porambo et al. | 455/143 |
| 5,742,897 A | * | 4/1998 | Plowdrey et al. | 455/142 |
| 5,917,387 A | * | 6/1999 | Rice et al. | 333/174 |
| 6,006,105 A | * | 12/1999 | Rostoker et al. | 455/552.1 |

(Continued)

FOREIGN PATENT DOCUMENTS

WO  WO 01/41424  * 6/2001

OTHER PUBLICATIONS

Kuhn, W.B., at al., "Q-Enhanced LC Bandpass Filters for Integrated Wireless Applications," IEEE Transactions on Microwave Theory and Techniques, Dec. 1998, pp. 2577-2586, vol. 46, No. 12, IEEE, New York, NY.

*Primary Examiner*—Duc M Nguyen
(74) *Attorney, Agent, or Firm*—Ronald O. Neerings; Wade James Brady, III; Frederick J. Telecky, Jr.

(57) ABSTRACT

A system and method integrates signal filters in a multiband transceiver. A preferred embodiment comprises an amplifier with a first tunable capacitor coupled to a signal input and a tunable filter. The tunable filter comprises an input stage with a first pair of inductors arranged in a dipole configuration and a second tunable capacitor coupled in parallel to the first pair of inductors and an output stage inductively coupled to the input stage, the output stage includes a second pair of inductors also arranged in a dipole configuration and a third tunable capacitor coupled in parallel to the second pair of inductors. The inductors are realized using bond wire or any other high Q material. The first tunable capacitor, the second tunable capacitor, and the third tunable capacitor can be tuned using a master-slave tuning configuration to adjust the operating frequency of the amplifier and the tunable filter to enable frequency band compatibility with multiple communications protocols.

16 Claims, 5 Drawing Sheets

U.S. PATENT DOCUMENTS

| | | | |
|---|---|---|---|
| 6,049,702 A * | 4/2000 | Tham et al. | 455/78 |
| 6,374,109 B1 * | 4/2002 | Shaheen et al. | 455/434 |
| 6,694,150 B1 * | 2/2004 | Standke et al. | 455/552.1 |
| 6,754,490 B2 * | 6/2004 | Okoro et al. | 455/432.2 |
| 7,092,676 B2 * | 8/2006 | Abdelgany et al. | 455/76 |
| 7,155,252 B2 * | 12/2006 | Martin et al. | 455/553.1 |
| 7,260,369 B2 * | 8/2007 | Feher | 455/133 |
| 7,324,493 B2 * | 1/2008 | Yamada et al. | 370/342 |
| 7,330,740 B2 * | 2/2008 | Bennett et al. | 455/574 |
| 2004/0029621 A1 * | 2/2004 | Karaoguz et al. | 455/574 |
| 2005/0020299 A1 * | 1/2005 | Malone et al. | 455/552.1 |
| 2005/0162570 A1 * | 7/2005 | Hall et al. | 348/735 |

* cited by examiner

INTEGRATED RADIO FREQUENCY FILTERS FOR MULTIBAND TRANSCEIVERS

This application claims the benefit of U.S. Provisional Application No. 60/607,085, filed on Sep. 3, 2004, entitled "Integrated Front End for Multi Band Receivers," which application is hereby incorporated herein by reference.

TECHNICAL FIELD

The present invention relates generally to a system and method for wireless communications, and more particularly to a system and method for integrating radio frequency signal filters in a multiband transceiver.

BACKGROUND

In wireless voice and data communications, there is a trend towards making a single communications device that is capable of operating with multiple communications protocols, such as global system for mobile telephony (GSM), enhanced GSM (EGSM), GSM digital communications system (GSM DCS), GSM personal communications system (GSM PCS), code-division multiple access cellular band (CDMA LB), CDMA PCS (CDMA HB), wideband CDMA cellular band (WCDMA LB), WCDMA PCS (WCDMA MB), WCDMA unified mobile telecommunications system (WCDMA HB), global positioning system (GPS), and so forth. These communications devices are commonly called "World Phones" since the intent is to have a single device that is compatible with the many different communications protocols in use throughout the world.

In order to be compatible with a large number of communications standards, a communications device must be compatible with the different communications protocols in use as well as be able to send and receive properly encoded information within the multitude of different operating frequency ranges that are in use throughout the world. Compatibility with the different communications protocols can be achieved with the use of adequate processing power and programming, while the ability to send and receive information in the different operating frequency ranges can require a significant amount of front-end hardware in terms of filtering, up/down conversion, amplification, and so forth. Front-end hardware can typically be defined as hardware between a device's antenna and hardware that is used for demodulating and decoding the received signal. This can be further exacerbated by the fact that certain communications protocols, such as the various CDMA and WCDMA communications protocols, require that both the transmitter and the receiver be on simultaneously. This can cause problems at the receiver since signals produced by the transmitter can overpower any signal that the receiver is attempting to detect (due to the close proximity of the transmitter to the receiver). In the case of GPS, the transmitted signal from the mobile phone with which the GPS receiver co-exists poses the problem of GPS receiver de-sensitization.

In addition to front-end circuitry for a receiver, similar circuitry is also needed at a transmitter side of the communications device. Filtering is also needed at the transmitter side to help prevent the situation wherein a signal being transmitted bleeds out of its designated frequency band and into other frequency bands, such as the frequency band of the receiver, for example.

One commonly used technique to afford the ability to send and receive information in the different operating frequency ranges is to have a different set of front-end hardware for each of the communications protocols and operating frequency ranges being supported by the communications device. This can provide the communications device with the ability to communicate using each communications protocol at any of the operating frequency range that may be used.

A technique that can be used to solve the problem of signals provided by the transmitter drowning out the receiver involves the use of a high-performance filter, such as a standing acoustic wave filter (SAW filter), that can be used to separate the received signal from the transmitted signal. The SAW filter is commonly referred to as an interstage filter. Passing the received signal through the high-performance filter can effectively isolate the received signal from the transmitted signal, thereby preventing the transmitted signal from overpowering the received signal.

One disadvantage of the prior art is that the presence of a different set of front-end hardware for each communications protocol at each operating frequency range can result in a large amount of additional front-end hardware, especially for communications devices that are compatible with a large number of communications protocols. Furthermore, a similar amount of hardware may be necessary for a transmit portion of the communications device. The large amount of hardware can be detrimental to the communications device in several ways, such as decreasing the performance, increasing the overall size and weight of the communications device, decreasing the reliability of the communications device, and so on.

A second disadvantage of the prior art technique of using the SAW filter is that the SAW filter is not conducive to integration. The inability to integrate the SAW filter requires that the signal path through the front-end hardware alternate between being on-chip (processed by circuitry that has been integrated into an integrated circuit) and off-chip (processed by circuitry that has not been integrated into an integrated circuit). When a signal makes the transition from on-chip to off-chip (or off-chip to on-chip), matching networks are needed to provide necessary impedance matching to help reduce signal loss. This can result in an increased in hardware requirement, as well as increased manufacturing costs, and decreased reliability. Furthermore, SAW filters are not tunable, a SAW filter for one band cannot be tuned to another band. Distinct SAW filters are needed for each band.

Yet another disadvantage of the prior art technique of using the SAW filter is that by going on and off chip within the signal path increases the number of input/output pins required for integrated circuits that are being used in the signal path. By increasing the number of input/output pins, the overall package size of the integrated circuits can increase as well as the overall cost of the integrated circuits, since packaging can account for a significant portion of the cost of the integrated circuit.

SUMMARY OF THE INVENTION

These and other problems are generally solved or circumvented, and technical advantages are generally achieved, by preferred embodiments of the present invention which provides a system and method for integrating high-performance filters for a multiband transceiver.

In accordance with a preferred embodiment of the present invention, a circuit comprising an amplifier coupled to a signal input, the amplifier to amplify a signal provided by the signal input to a specified level and a tunable inductor-capacitor (LC) filter having an input coupled to an output of the amplifier and an output coupled to the mixer, is provided. The amplifier comprises a first tunable capacitor that is tunable by a reference oscillator, wherein the first tunable capacitor is configured to tune a matching network coupled to the signal input to meet a specified return loss requirement. The tunable LC filter comprises an input stage comprising a first pair of inductors arranged in a dipole configuration, each inductor created from a high Q conductive material, and a second tunable capacitor coupled in parallel to the first pair of inductors, the second tunable capacitor to adjust the frequency response of the input stage. The tunable LC filter further comprises an output stage inductively coupled to the input stage, the output stage comprising a second pair of inductors arranged in a dipole configuration, each inductor created from a high Q conductive material, and a third tunable capacitor coupled in parallel to the second pair of inductors, the third tunable capacitor to adjust the frequency response of the output stage.

In accordance with another preferred embodiment of the present invention, an integrated circuit for a multi-standard wireless communications device is provided. The integrated circuit comprises a front-end circuit, the front-end circuit having an input coupled to a matching network and the matching network is coupled to a signal input, wherein the signal input provides signals compliant to one or more communications standards, the front-end circuit comprises an amplifier coupled to the signal input, the amplifier to amplify a signal provided by the signal input to a specified level and a tunable inductor-capacitor (LC) filter having an input coupled to an output of the amplifier and an output coupled to the mixer. The amplifier comprises a first tunable capacitor that is tunable by a reference oscillator, wherein the first tunable capacitor is configured to tune a matching network coupled to the signal input to meet a specified return loss requirement. The tunable LC filter comprises an input stage comprising a first pair of inductors arranged in a dipole configuration, each inductor created from a high Q conductive material, and a second tunable capacitor coupled in parallel to the first pair of inductors, the second tunable capacitor to adjust the frequency response of the input stage. The tunable LC filter further comprises an output stage inductively coupled to the input stage, the output stage comprising a second pair of inductors arranged in a dipole configuration, each inductor created from a high Q conductive material, and a third tunable capacitor coupled in parallel to the second pair of inductors, the third tunable capacitor to adjust the frequency response of the output stage. The integrated circuit further comprises a digital processing circuit coupled to the front-end circuit, the digital processing circuit is configured to decode a digital representation of a signal provided by the front-end circuit into data.

In accordance with another preferred embodiment of the present invention, a method for integrating signal filters for a multiband transceiver is provided. The method comprises grouping communications protocols based on frequency band usage and performance requirements, determining a number of front-end circuits required, and specifying characteristics for tunable capacitors and inductors needed in each of the front-end circuits, wherein the inductors are fabricated using a high Q conductive material.

An advantage of a preferred embodiment of the present invention is that by integrating the high-performance filters, it is possible to reduce the size and cost of the hardware as well as increase the reliability and performance. This can result in a smaller and less costly device with greater reliability.

Another advantage of the present invention is that through the use of tunable capacitors and inductors in the front-end circuits, a single front-end circuit can be used with several communications protocols (as long as the communications protocols use frequency ranges that are in relatively close proximity). This can reduce the number of front-end circuits needed in a multiband transceiver, thereby reducing hardware requirements.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a transmitter and a receiver (a transceiver) for a multi-standard communications device. The invention may also be applied, however, to a transmitter and/or a receiver for any wireless device wherein there is a need to transmit and/or receive wireless transmitted signals that can require the use of filters to separate transmitted signals and received signals. Note that certain linearity issues may apply to the use of the present invention to a transmitter side of a wireless device. However, these issues can be addressed.

Figure 1:
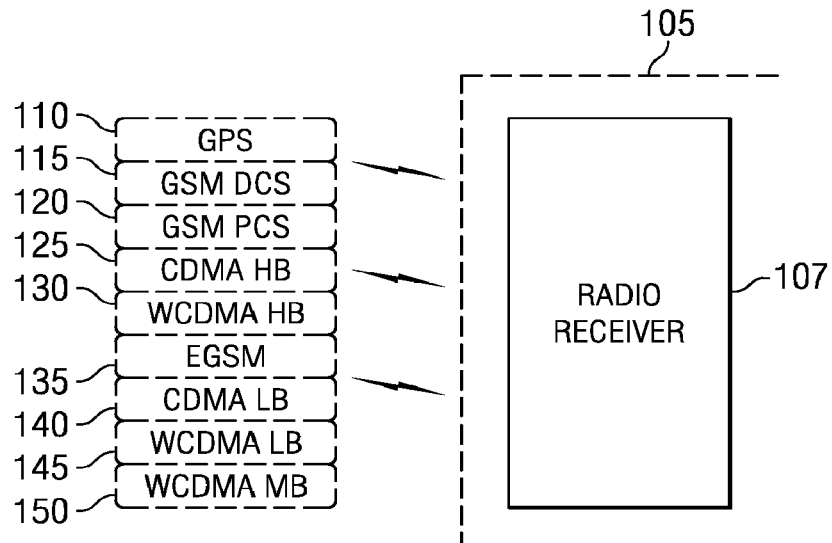
FIG. 1 is a diagram of a receiver portion of a communications device that is compatible with a wide variety of communications standards.

With reference now to FIG. 1, there is shown a diagram illustrating a receiver portion of a communications device 105 that is compatible with a wide variety of communications standards. The diagram shown in FIG. 1 illustrates a portion of the communications device 105 that includes a receiver 107 of the communications device 105. Note that a communications device 105 can include an antenna and other circuitry, such as a transmitter, baseband circuitry, and glue logic, but these circuits and others have been omitted to maintain simplicity.

The communications device 105 is compatible with a wide variety of communications protocols, such as GPS 110, GSM DCS 115, GSM PCS 120, CDMA HB 125, WCDMA HB 130, EGSM 135, CDMA LB 140, WCDMA LB 145, WCDMA MB 150, and so forth. Each of these communications protocols can use a different signaling standard and/or transmit and receive over a different frequency band. Therefore, in order for the communications device 105 to be compatible with all of the communications protocols, the communications device 105 must have circuitry that can be used to process the different signaling standards used as well as circuitry to receive and transmit the signals at the proper frequencies.

Certain communications protocols, such as GPS 110, CDMA HB 125, CDMA LB 140, WCDMA HB 130, WCDMA LB 145, and WCDMA MB 150, require that both the communication device's receiver and transmitter be turned on simultaneously. This can present a problem due to the fact that transmissions from the communication device's transmitter can drown out signals that the receiver is attempting to detect. Other communications protocols, such as GSM DCS 115, GSM PCS 120, and EGSM 135 are time multiplexed and compatible receivers and transmitters are never on simultaneously, therefore they do not suffer from the same problem.

The use of a high performance filter can be used to separate the transmitted signal from the received signal and can prevent the saturation of the receiver. The high performance filter can be used at both the receiver portion of the communications device 105 as well as the transmitter portion of the communications device 105. Note that while the discussion presented in these specifications focuses on the receiver portion of a communications device and the use of high-performance filters in the front-end circuitry of the receiver, the high-performance filters can also be used in the transmitter portion of the communications with attention paid to certain linearity issues. The focus on the receiver portion should not be construed as limiting the scope of the present invention to receiver circuitry.

Figure 2:
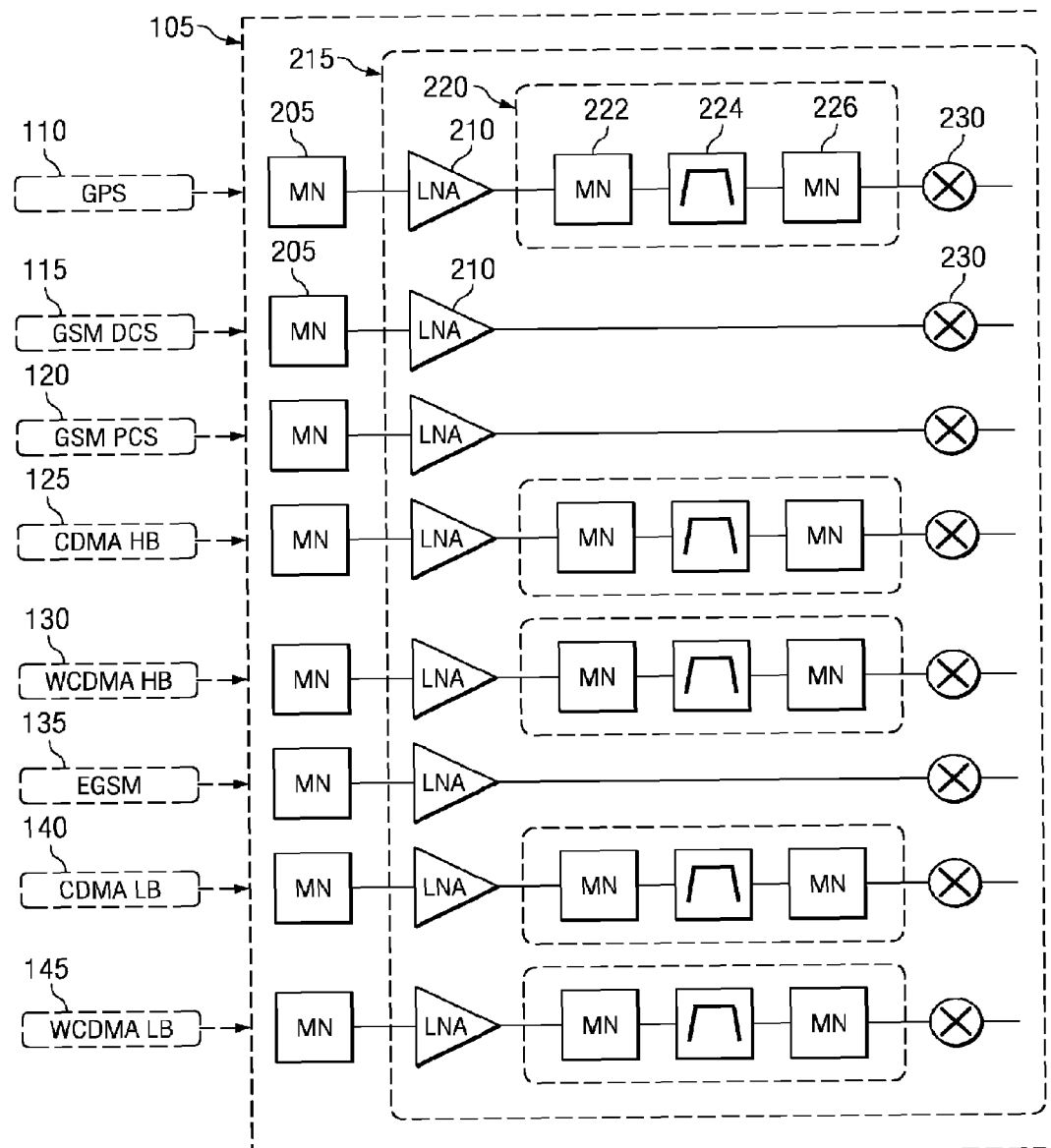
FIG. 2 is a diagram of a receiver portion of a communications device with emphasis placed upon the front-end circuitry of the receiver portion.

With reference now to FIG. 2, there is shown a diagram illustrating a receiver portion of a communications device 105 that is compatible with a wide variety of communications protocols, wherein front-end circuitry of the communications device 105 is emphasized. The diagram shown in FIG. 2 provides a detailed view of the front-end circuitry needed for the reception of various communications protocols. For example, for signals compliant with the GPS communications protocol 110, the front-end circuitry can include a matching network 205, which is used to provide impedance matching between a conductive trace on a printed circuit board and an integrated circuit and a low-noise amplifier (LNA) 210, which can be used to amplify the GPS signal to a signal level that is compatible for processing by circuitry later in the signal processing chain. The LNA 210 can be integrated into an integrated circuit 215 that is used to perform signal processing duties for the communications device 105, among other functions. However, due to a situation with the GPS communications protocol, wherein transmissions from a transmitter side of the communications device 105 leak into the GPS receiver, filtering of the amplified signal is required. The high-performance filter can be difficult to implement on an integrated circuit, and therefore, is commonly implemented off-chip. Since the signal is being taken off-chip, a matching network is required to help reduce signal loss due to impedance mismatch.

The high-performance filter and its matching networks are shown as circuit sequence 220 comprising a first matching network 222, the high-performance filter 224, and a second matching network 226. Although the circuit sequence 220 is shown in FIG. 2 as being internal to the integrated circuit 215, all of the components of the circuit sequence 220 (the first matching network 222, the high-performance filter 224, and the second matching network 226) are external to the integrated circuit 215. Note that the second matching network 226 is required for impedance matching for the signal as it is brought back into the integrated circuit 215. After the signal has been brought back into the integrated circuit 215, a mixer 230 can be used to down-convert the signal. The remainder of the front-end circuitry remains in the integrated circuit 215 and will not be discussed further herein. The front-end circuits for other communications protocols, such as CDMA HB 125, WCDMA HB 130, CDMA LB 140, WCDMA LB 145, and WCDMA MB 150, also require the use of high-performance filters to help prevent receiver saturation and therefore have circuit sequences similar to the circuit sequence 220. Note that by having to go off-chip for the high-performance filter, three additional input/output pins (due to the differential signal used for the mixer 230) are needed in the packaging of the integrated circuit 215. While three additional input/output pins are not a large number, if multiple communications protocols are used that require going off-chip for filtering purposes, then the additional input/output pins can add up rapidly.

When a communications protocol does not need the use of a high-performance filter to isolate the transmitted signal and the received signal, such as with the GSM DCS communications protocol 115, then the front-end circuitry can be significantly simpler. As with the front-end circuit for the GSP communications protocol 110, the front-end circuit for the GSP communications protocol 110 includes a matching network 205 that is needed to impedance match the DCS signal as it is being brought onto the integrated circuit 215. The front-end circuit also includes a LNA 210 for signal amplification purposes and a mixer 230.

Not only does the need to go off-chip and then back on-chip increase the total number of input/output pins required for the integrated circuit 215, a commonly used high-performance filter (a standing acoustic wave (SAW) filter) is typically a physically large component, whose size can vary depending upon the frequency of the signal being filtered and the intended quality of the filtering. Therefore, due to advancements in integrated circuit manufacturing processes, a SAW filter can be significantly larger than an integrated circuit designed to perform the necessary signal processing for a corresponding communications protocol. Furthermore, while the matching networks (such as matching networks 205, 222, and 226) are not as physically large as the SAW filter, their size can not be ignored in the design of the communications device, with each matching network typically having three components (inductors and capacitors).

Figure 3:
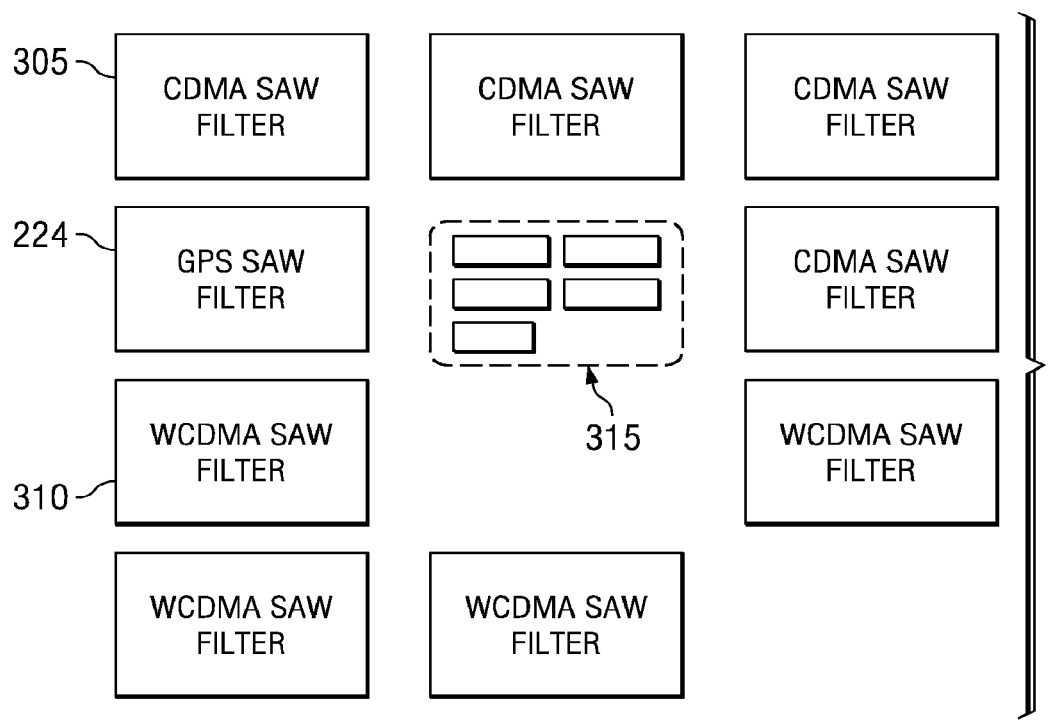
FIG. 3 is a diagram of a receiver portion of a communications device with a comparison in the size of SAW filters and an integrated circuit used for communications protocol processing.

With reference now to FIG. 3, there is shown a diagram illustrating a view of a receiver portion of a communications device 105, with emphasis placed on the size of various SAW filters in comparison to the size of an integrated circuit 315 used to perform communications protocol processing. The diagram shown in FIG. 3 illustrates a high-level view of a receiver portion of the communications device 105, such as a circuit board for the communications device 105. The diagram shows several SAW filters, such as the GPS SAW filter 224, a CDMA SAW filter 305, and a WCDMA SAW filter 310. The SAW filters are displayed as a monolithic block intended to represent a physical implementation of the filter.

The diagram also shows the integrated circuit 315. The integrated circuit 315 can contain circuitry used in the signal processing of the received signal and can include components such as low-noise amplifiers, mixers, and so forth. The integrated circuit 315 can also contain circuitry that is required to process the received signal in a manner that is compatible with a particular communications protocol.

Each of the SAW filters (such as the GPS SAW filter 224, the CDMA SAW filter 305, or the WCDMA SAW filter 310) is significantly larger than the integrated circuit 315. Therefore, for the communications device 105 that is compatible with a large number of communications protocols (for example, the communications device 105 is shown in FIG. 1 to be compatible with nine (9) communications protocols), then the receiver portion of the communications device 105 may have to be large enough to contain the integrated circuit 315 and nine SAW filters that are each typically at least as large as the integrated circuit 315. Clearly, a significant amount of space is consumed in the receiver portion of the communications device 105 by the SAW filters. Additionally, the routing of signals in and out of the integrated circuit 315 can become challenging as well as possibly degrading performance.

Figure 4A:
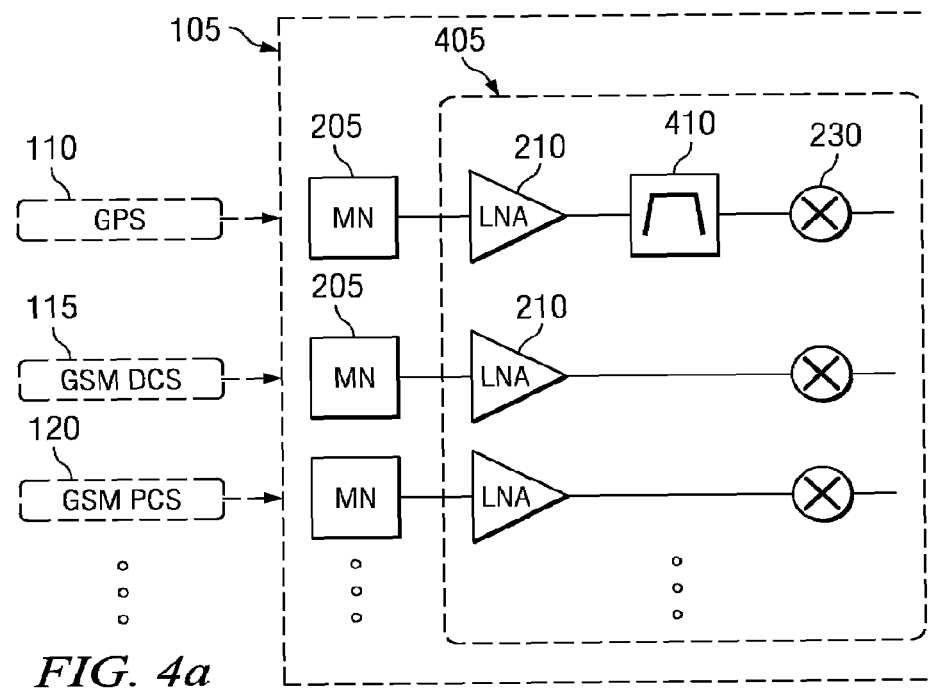
FIGS. 4a and 4b are diagrams of a receiver portion of a communications device with integrated high-performance filters, according to a preferred embodiment of the present invention.

With reference now to FIG. 4a, there is shown a figure illustrating a view of a receiver portion of a communications device 105, wherein a high-performance filter 410 is integrated into an integrated circuit 405, according to a preferred embodiment of the present invention. The diagram shown in FIG. 4a illustrates the preferred embodiment of front-end circuitry compatible with several of the communications protocols, such as, GPS 110, DCS 115, and PCS 120. Taking into closer consideration, the front-end circuitry for the GPS communications protocol 110. The front-end circuitry includes the matching network 205, the LNA 210, and the mixer 230. These three components were also present in the front-end circuitry for the GPS communications protocol 110 for the communications device 105 shown in FIG. 2. However, since the high-performance filtering required by the GPS communications protocol can now be performed by an integrated high-performance filter 410, the circuitry sequence 220 (FIG. 2), comprising the first matching network 222, the high-performance (SAW) filter 224, and the second matching network 226, can be eliminated since the received signal does not need to go off-chip. The front-end circuitry for communications protocols that do not require high-performance filtering can remain the same as what was shown in FIG. 2, for example, the front-end circuitry for the GSM DCS and GSM PCS communications protocols 115 and 120).

The elimination of the SAW filter by integrating a high-performance filter (such as the high-performance filter 410) and the additional input/output pins for each of the communications protocols that require the high-performance filtering can result in considerable savings in overall receiver size and cost as well as increasing reliability. Similar size and cost savings can be achieved at a transmitter portion of the communications device, wherein the signal path for these communications protocols also requires the high-performance filtering.

While there may be a large number of different communications protocols in active use, many of the communications protocols operate in adjacent frequency bands. Note that in certain applications, the frequency bands can also be overlapping. For example, communications protocols that are used in different regions of the world can have overlapping frequency bands since they are never in use simultaneously in a single region. Since a filter operates on a received signal within a certain frequency range and is not dependent upon the actual content of the received signal, it is possible to pass a received signal from several different communications protocols through a single filter, as long as the frequency response of the filter is compatible with the requirements of the communications protocol. The grouping of communications protocols based on frequency band can further reduce hardware requirements. For example, it can be possible to group received signals of the CDMA HB communications protocol 125 with that of the WCDMA HB communications protocol 130 together and then share a single filter rather than having a separate filter for each received signal.

Figure 4B:
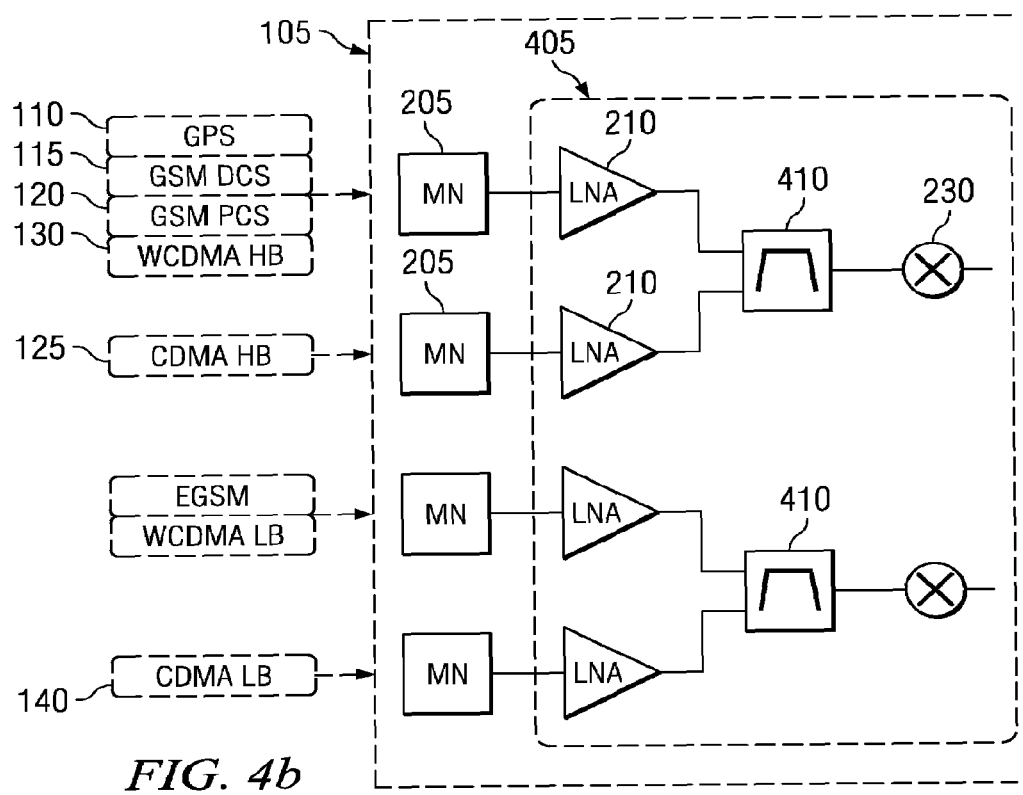

With reference now to FIG. 4b, there is shown a figure illustrating a view of a receiver portion of a communications device 105, wherein frequency band grouping is used in conjunction with integrated high-performance filters 410, according to a preferred embodiment of the present invention. The diagram shown in FIG. 4b illustrates front-end circuitry for the communications device 105, wherein groupings of different communications protocols based on their frequency band requirements has occurred. For example, received signals from the GPS 110, GSM DCS 115, GSM PCS 120, and WCDMA HB 130 communications protocols can be grouped together based on their frequency band usage requirements. The grouping of these four communications protocols together can permit the sharing of a single front-end circuit instead of four front-end circuits. Furthermore, due to different performance requirements, received signals from the CDMA HB communications protocol 125 are not grouped with the previously described group. However, once the received signal has been amplified (by LNA 210), the received signals of the CDMA HB communications protocol 125 can share the remainder of the front-end circuitry as those from the combined group of the GPS 110, DCS 115, PCS 120, and WCDMA HB 130 communications protocols. This single grouping enables the use of hardware equivalent to slightly more than one front-end circuit for five different communications protocols.

The diagram shown in FIG. 4b illustrates the use of dedicated LNAs 210 for a single high-performance filter 410. A reason for requiring a dedicated LNA for a communications protocol(s) may include: comparatively higher linearity requirement for one communications protocol, the matching network 205 may not be broad enough to cover all the frequency band used by the communications protocols, a switch (not shown) in the frond end filters/duplexer may not be recommended for a band, and so forth.

In certain situations, it may not be feasible to create an integrated high-performance filter that meets the performance criteria needed for a certain communications protocol. For example, with the CDMA LB communications protocol 140, the frequency bands of the transmit and the receive information may be too close together and it may be difficult to design an integrated high-performance filter that can meet the frequency response. In this case, it can be necessary to bring the received signal off-chip and make use of a SAW filter, such as SAW filter 224 and associated matching networks, such as matching networks 222 and 226. Front-end circuitry for this situation would have an appearance similar to that shown in FIG. 2 and the circuit sequence 220. Note that in FIG. 4b, the CDMA LB communications protocol 140 and attendant front-end circuit is shown as being integrated into the integrated circuit 405, but if the high-performance filter 410 is not capable of meeting performance requirements, then it would be necessary to bring the signal off-chip and make use of a SAW filter.

The bond wires (or bonding wires) used in bonding input/output pads from an integrated circuit to input/output pins on an integrated circuit package can be used to create inductors with a high quality factor (Q). Due to the high operating frequencies of the different communications protocols (on the order of a Giga-hertz and above), relatively small inductors are needed. When used in combination with tunable capacitors, the bond wire inductors can be used to form coupled resonator filters that can be used to filter the received signal in the communications device 105.

Figure 5:
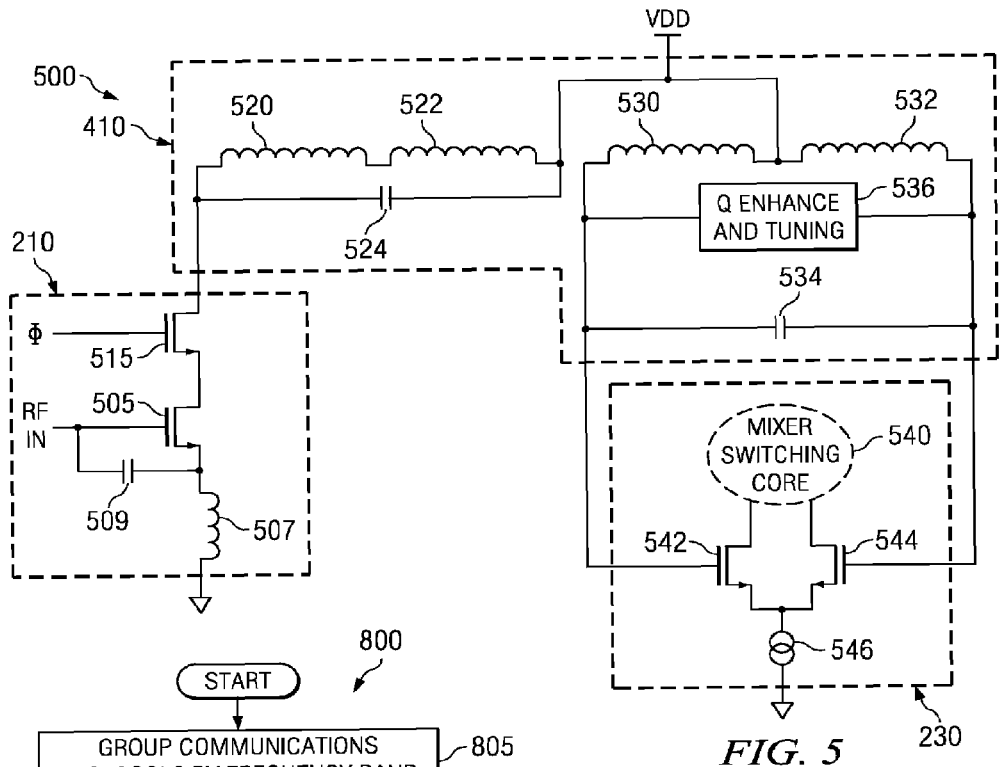
FIG. 5 is a diagram of a portion of a front-end circuit with an integrated high-performance filter, according to a preferred embodiment of the present invention.

With reference now to FIG. 5, there is shown a diagram illustrating a schematic of a portion of a front-end circuit 500, wherein an integrated high-performance filter 410 featuring bond wire inductors enables a reduction in the circuitry of a communications device 105, according to a preferred embodiment of the present invention. The front-end circuit 500 can be used for an unbalanced input signal and converts the unbalanced input signal into a balanced signal. The diagram shown in FIG. 5 illustrates portions of the front-end circuit 500 that has been integrated into an integrated circuit, namely, the LNA 210, the integrated high-performance filter 410, and the mixer 230 portion of the front-end circuit 500. The front-end circuit 500 may have other circuitry, but they are beyond the scope of the present invention and will not be discussed herein. An alternate embodiment for use with a balanced input signal is discussed below.

The LNA 210 can be implemented using one of many standard low-noise amplifier designs. One possible design for the LNA 210 can include a transistor 505 (preferably a high-gain field-effect transistor (FET) or bi-polar junction transistor (BJT), with a FET being shown in FIG. 5) with its gate (or base if a BJT is used) terminal coupled to the received signal (shown as radio frequency (RF) in). The gate terminal (or base terminal if a BJT is used) can also be referred to as being a control terminal of the transistor. One of the transistor's source/drain (or emitter if a BJT is used) terminals can be coupled to electrical ground through an inductor 507. According to a preferred embodiment of the present invention, the inductor 507 can be fabricated using bond wires. A capacitor 509 can couple the gate terminal (or base terminal) of the transistor 505 to the source/drain terminal (or emitter terminal). The capacitor 509 can be used to tune the matching network 205 (not shown in FIG. 5) to meet the return loss requirement of the differing communications protocols. According to a preferred embodiment of the present invention, the capacitor 509 can be tuned using a phased-lock loop (PLL) oscillator, such as one that can be used in a digital-controlled oscillator (DCO) (not shown), wherein the DCO is the master and the capacitor 509 is the slave. The PLL in the DCO can be used as a reference in tuning the capacitor 509. The technique of master-slave tuning is considered to be well understood by those of ordinary skill in the art of the present invention and will not be discussed further herein.

Also part of the LNA 210 is a second transistor 515. As with the transistor 505, either a FET or BJT can be used as the second transistor 515, with the diagram showing a FET. The gate terminal of the second transistor 515 is coupled to AC ground. The second transistor 515 can be used to increase the output impedance of the transistor 505 as well as providing isolation between RF input and RF output.

The output of the LNA 210, a source/drain terminal of the second transistor 515, can be provided to an unbalanced input of the integrated high-performance filter 410. At the input side of the integrated high-performance filter 410, two inductors 520 and 522 couple the output of the LNA 210 to a power source "VDD." The two inductors 520 and 522 can be arranged into a dipole configuration to provide the desired inductance with reduced coupling, with a common mode point of the two inductors 520 and 522 being coupled to the power source "VDD," while the output of the LNA 210 is coupled to the output node of the two inductors 520 and 522. The dipole configuration has an advantage in that a current flowing through one inductor (such as inductor 520) flows in direction that is opposite of a current flowing through the other inductor (such as inductor 522).

Furthermore, a second capacitor 524 can also be arranged in a parallel fashion across the two inductors 520 and 522. As with the capacitor 509, the second capacitor 524 can be tuned and when used in conjunction with the two inductors 520 and 522, the frequency response of an LC (inductor-capacitor) filter can be adjusted. With an unbalanced input or with a balanced input, the two inductors 520 and 522 can be configured in a sequential manner to provide the desired inductance.

A second set of two inductors 530 and 532 is also arranged in relatively close proximity to the two inductors 520 and 522, with the actual closeness being dependent upon a desired amount of inductive coupling between the two inductors 520 and 522 and the second set of two inductors 530 and 532. The second set of two inductors 530 and 532 can also be arranged into a dipole configuration. The dipole configuration has an advantage in that a current flowing through one inductor (such as inductor 530) flows in direction that is opposite of a current flowing through the other inductor (such as inductor 532). This arrangement can help to reduce coupling between the two inductors. A third capacitor 534 can be arranged in parallel to the second set of two inductors 530 and 532 and can serve a similar function as the second capacitor 524, namely to afford adjustments in the frequency response of the LC filter.

As discussed previously, the quality of the integrated high-performance filter 410 can be very important to the operation of the communications device 105. A poor performing filter can result in poor quality communications, such as low quality voice or low data transfer rates, increased dropped connections, increased failures to establish connections, and so forth. A Q enhance and tuning (QET) circuit 536 can be used to enhance (increase) the Q, a measure of the quality of the integrated high-performance filter 410, as well as tune the shape and position of the frequency response of the integrated high-performance filter 410.

Figure 6:
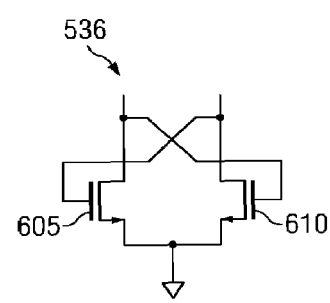
FIG. 6 is a diagram of a Q enhance and tune circuit, according to a preferred embodiment of the present invention.

With reference now to FIG. 6, there is shown a diagram illustrating a QET circuit 536, according to a preferred embodiment of the present invention. The QET circuit 536 can be implemented using a pair of cross-coupled transistors 605 and 610. The pair of cross-coupled transistors 605 and 610 can be implemented using FETs or BJTs, with FETs being shown in FIG. 6. The QET circuit 536 can be used to provide a negative transconductance (or equivalently, a negative resistance). The negative resistance counters the intrinsic resistance in the bond wire inductors. This can effectively increase the Q of the bond wire inductors. The use of the QET circuit 536 can realize the required Q factor by compensating for variations in a base Q factor in the bond wire inductors over operating frequency and temperature. The use of circuits such as the QET circuit 536 is well known by those of ordinary skill in the art of the present invention.

With reference back to FIG. 5, the output of the two inductors 530 and 532 (at a left node of the inductor 530 and a right node of the inductor 532) form a differential mode signal and can be provided to the mixer 230. The mixer 230 can be implemented using one of many different mixer designs intended for balanced signals. According to a preferred embodiment of the present invention, the mixer 230 includes a mixer switching core 540, two transistors 542 and 544, and a current source 546. Note that the two transistors 542 and 544 are shown as FETs, but BJTs can be used in their place. The outputs from the two inductors 530 and 532 can be connected to one of the two gate terminals of the pair of transistors 542 and 544.

Figure 7:
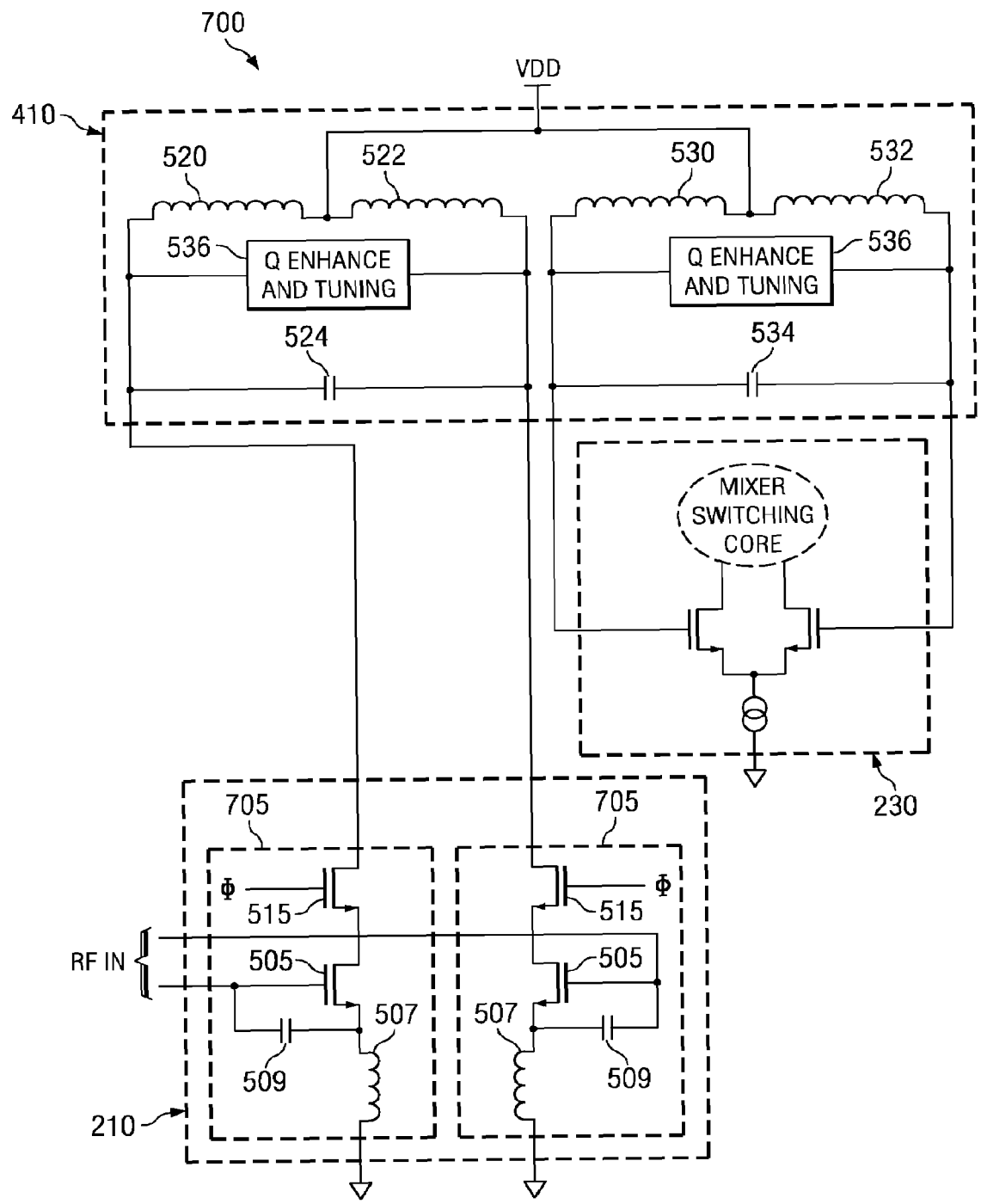
FIG. 7 is a diagram of a portion of a front-end circuit with an integrated high-performance filter, according to a preferred embodiment of the present invention.

With reference now to FIG. 7, there is shown a diagram illustrating a schematic of a portion of a front-end circuit 700, wherein an integrated high-performance filter 410 featuring bond wire inductors enables a reduction in the circuitry of a communications device 105, according to a preferred embodiment of the present invention. As shown in FIG. 7, the front-end circuit 700 is for a balanced input signal and produces a balanced output signal at the output of a mixer 230. A balanced input differs from an unbalanced input in that the balanced input is represented as a two signal value, whereas an unbalanced input is a single signal value.

The LNA 210 can have a design that is similar to the design of the LNA 210 (FIG. 5), with an exception being that since the front-end circuit 700 operates with a balanced input signal, the LNA 210 has two amplifier stages 705. Each of the two amplifier stages 705 can include a transistor 505 (preferably a high-gain FET or BJT), which operates as an amplifier.

Similar to the LNA 210 shown in FIG. 5, the transistor 505 can have its gate terminal coupled to one of the two input signals (labeled RF IN) while one of the transistor's source/drain terminals can be coupled to electrical ground via the inductor 507. According to a preferred embodiment of the present invention, the inductor 507 can be formed using bond wires in a similar manner to inductors shown in FIG. 5. The gate terminal and the source/drain terminal of the amplifier 505 can be coupled via the capacitor 509, which can be used to tune the matching network 205 (not shown in FIG. 5) to meet the return loss requirement of the differing communications protocols. As in the front-end circuit 500 shown in FIG. 5, the capacitor 509 can be tuned using a master-slave tuning method using a PLL oscillator, such as one in a DCO (not shown).

Also in each of the two amplifier stages 705 is a transistor 515 can be used to couple a drain terminal of the transistor 505 to an input stage of the integrated high-performance filter 410. As with the transistors 505, either a FET or BJT can be used as the second transistor 515, with a FET shown. The gate terminal of the second transistor 515 can be coupled to AC ground and the second transistor 515 can be used to increase the output impedance of the transistor 505 as well as to provide isolation between RF input and RF output. The two outputs of the LNA 210 can be provided to a balanced input of the integrated high-performance filter 410. At the input side of the integrated high-performance filter 410, two inductors 520 and 522 couple the outputs of the LNA 210 to a power source "VDD." As in the case where the RF IN signal is unbalanced, with the balanced RF IN signal, the two inductors 520 and 522 can also be arranged in a dipole configuration, wherein currents flowing through the two inductors 520 and 522 can have opposite direction, thereby reducing coupling.

The two outputs of the LNA 210 can be coupled to the output terminals of the two inductors 520 and 522. A common mode point of the two inductors 520 and 522 can be coupled to a power supply, "VDD." Also coupling the two inputs of the LNA 210 together is the second capacitor 524 and the QET circuit 536. The second capacitor 524 can be used to tune the frequency response of the high-performance filter 410 when used in conjunction with the two inductors 520 and 522. The QET circuit 536 can be used to improve the quality of the LC filter. A discussion of the operation of the QET circuit 536 was provided previously.

A second set of two inductors 530 and 532 is also arranged in relatively close proximity to the two inductors 520 and 522, with the actual closeness being dependent upon a desired amount of inductive coupling. A third capacitor 534 can be arranged in parallel to the second set of two inductors 530 and 532 and can serve a similar function as the second capacitor 524, namely to afford adjustments in the frequency response of the high-performance filter 410. Note that the capacitors 524, 534, as well as the capacitors 509 can be tuned using the same method, namely the master-slave technique using a PLL of a DCO.

A second QET circuit 536 can be used to enhance (increase) the Q, a measure of the quality of the integrated high-performance filter 410, as well as tune the actual amount of enhanced Q desired of the integrated high-performance filter 410. The output from the two inductors 530 and 532 can then be provided to the mixer 230. The mixer 230 can be implemented using one of many different mixer designs intended for balanced signals. According to a preferred embodiment of the present invention, the mixer 230 can be implemented using a design similar to the mixer 230 shown in FIG. 5.

A common fabrication technique that can be used to create the inductors, such as the inductors 520, 522, 530, and 532 (FIG. 7), on an integrated circuit would be to fabricate the design of the integrated circuits on the semiconductor substrate and create contact pads for the inductors. Then, after the integrated circuit has been passivated, the bond wires that are used to create the inductors can be attached to appropriate contact pads to create the inductors. The creation of the inductors can then be performed at the same time as the packaging of the integrated circuit. As such, the bond wires forming inductors can be sensitive to damage since the bond wires used to create the inductors are not protected by a passivation layer, as is the remainder of the integrated circuit.

Another method that can be used to create the inductors using bond wires is to make use of flip chip technology. First, fabricate the integrated circuit on a semiconductor substrate as above, then using Low Temperature Co-Fired Ceramic (LTCC) technology, the bond wires can be formed on an insulator substrate. The integrated circuit can then be flipped and mounted onto the insulator substrate and subsequently packaged. An advantage of the flip chip technology is that the inductors formed from the bond wires are now protected from damage. However, it may be necessary to consider the quality factor (Q) of the inductors created using LTCC and area they consume.

Figure 8:
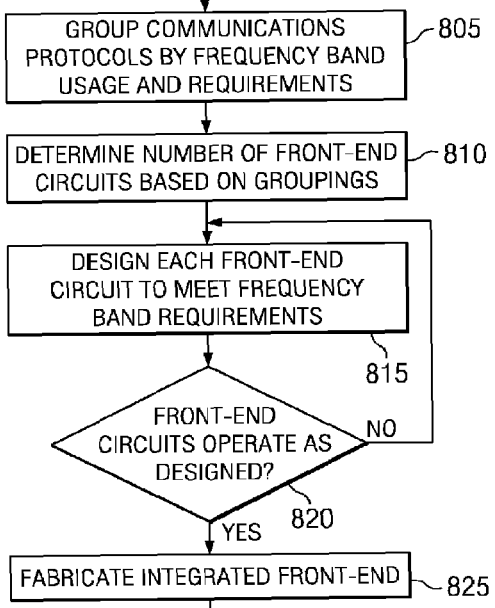
FIG. 8 is a diagram of a sequence of events in the design of an integrated front-end circuit, according to a preferred embodiment of the present invention.

With reference now to FIG. 8, there is shown a flow diagram illustrating a sequence of events 800 in the design of an integrated front-end for a communications device compatible with a plurality of communications protocols, according to a preferred embodiment of the present invention. The design of the integrated front-end for a communications device can be dependent upon factors such as the number of communications protocols that the communications device is expected to support, the frequency requirements of each of the communications protocols, and so forth. Therefore, an initial step can be to group the communications protocols based upon the frequency bands that each uses as well as the frequency requirements for each of the communications protocols (block 805). The number of front-end circuits required can then be determined from the number of groups (block 810). Another consideration may be if the communications device uses antenna diversity. If the communications device does use antenna diversity, then the total number of front-end circuits increases by the degree of antenna diversity.

It is then necessary to design the front-end circuit to meet frequency band and performance requirements (block 815). For example, some communications protocols, such as GSM and EGSM, do not need the high-performance filter since their receivers and transmitters are not simultaneously powered. The design of the front-end circuit can involve the design of a LNA and a high-performance filter for each front-end circuit. The LNA and the high-performance filter can be designed in conjunction so that the tunable capacitors in the LNA and the high-performance filter as well as the inductors in the high-performance filter made from the high Q conductive material can be adjusted to meet the frequency band requirements. After designing the LNA and the high-performance filter for each front-end circuit, the performance of the LNA and the high-performance filter can be simulated to determine if they perform as designed (block 820). If the LNAs and the high-performance filters do not perform as designed, then they need to be redesigned (block 815). If the front-end circuits perform as designed, the integrated front-end circuits can be fabricated (block 825).

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit comprising:
    an amplifier coupled to a signal input, the amplifier to amplify a signal provided by the signal input to a specified level, the amplifier comprising a first tunable capacitor, wherein the first tunable capacitor is tuned by a reference oscillator, and wherein the first tunable capacitor is configured to tune a matching network coupled to the signal input to meet specified return loss requirements;
    a tunable inductor-capacitor (LC) filter having an input coupled to an output of the amplifier and an output coupled to a mixer, the tunable LC filter comprising:
    an input stage comprising:
        a first pair of inductors arranged in a dipole configuration, each inductor created from a high Q conductive material;
        a second tunable capacitor coupled in parallel to the first pair of inductors, the second tunable capacitor to adjust the frequency response of the input stage; and
    an output stage inductively coupled to the input stage, the output stage comprising:
        a second pair of inductors arranged in a dipole configuration, each inductor created from a high Q conductive material; and
        a third tunable capacitor coupled in parallel to the second pair of inductors, the third tunable capacitor to adjust the frequency response of the output stage.

2. The circuit of claim 1, wherein the output stage of the tunable LC filter further comprises a Q enhance and tune (QET) circuit coupled in parallel to the second pair of inductors, the QET circuit to permit adjustments to a quality factor (Q) of the tunable LC filter by providing a negative resistance.

3. The circuit of claim 2, wherein the QET circuit comprises a pair of cross-coupled transistors, wherein a control terminal of a first transistor is coupled to a first terminal of a second transistor, wherein a control terminal of the second transistor is coupled to a first terminal of the first transistor, and wherein a second terminal of the first transistor and a second terminal of the second transistor is coupled to electrical ground.

4. The circuit of claim 1, wherein the first tunable capacitor, the second tunable capacitor, and the third tunable capacitor are tuned by the reference oscillator.

5. The circuit of claim 4, wherein the reference oscillator comprises a phased-lock loop (PLL) oscillator used in a digital controlled oscillator (DCO).

6. The circuit of claim I, wherein the high Q conductive material comprises bond wire.

7. The circuit of claim 1, wherein the high Q conductive material comprises bond wire, and wherein the high Q conductive material is placed over input/output pads formed onto a semiconductor substrate to create inductors.

8. The circuit of claim 1, wherein the high Q conductive material comprises bond wire, and wherein the high Q conductive material is placed onto a substrate and a semiconductor substrate containing integrated circuitry is placed on top of the substrate with the high Q conductive material to create inductors.

9. The circuit of claim 1, wherein the signal input is unbalanced, wherein the amplifier comprises a third transistor having a control terminal coupled to the signal input and a fourth transistor coupled in between an output terminal of the third transistor and the input stage of the tunable LC filter, the fourth transistor having a control terminal coupled to AC ground.

10. The circuit of claim 1, wherein the signal input is balanced, wherein the amplifier comprises two pair of transistors, a first pair comprising a fifth transistor having a control terminal coupled to the signal input and a sixth transistor coupled in between an output terminal of the fifth transistor and the input stage of the tunable LC filter and a second pair comprising a seventh transistor having a control terminal coupled to the signal input and an eighth transistor coupled in between an output terminal of the seventh transistor and the input stage of the tunable LC filter, the sixth transistor and the eight transistor having control terminals coupled to AC ground.

11. The circuit of claim 10, wherein the input stage further comprises a Q enhance and tune (QET) circuit coupled in parallel to the first pair of inductors, the QET circuit to permit adjustments to the Q of the tunable LC filter.

12. An integrated circuit for a multi-standard wireless communications device, the integrated circuit comprising:

a front-end circuit, the front-end circuit having an input coupled to a matching network, the matching network being coupled to a signal input, wherein the signal input provides signals compliant to one or more communications standards, the front-end circuit comprising:
  an amplifier coupled to the matching network, the amplifier to amplify a signal provided by the matching network to a specified level, wherein the amplifier comprises a first tunable capacitor, wherein the first tunable capacitor is tuned by the reference oscillator, and wherein the first tunable capacitor is configured to tune a matching network coupled to the signal input to meet specified return loss requirements;
  a tunable LC filter having an input coupled to an output of the amplifier and an output coupled to a mixer, the tunable LC filter comprising:
    an input stage comprising:
      a first pair of inductors arranged in a dipole configuration, each inductor created from a high Q conductive material;
      a second tunable capacitor coupled in parallel to the first pair of inductors, the second tunable capacitor to adjust the frequency response of the input stage;
    an output stage inductively coupled to the input stage, the output stage comprising:
      a second pair of inductors arranged in a dipole configuration, each inductor created from a high Q conductive material;
      a third tunable capacitor coupled in parallel to the second pair of inductors, the third tunable capacitor to adjust the frequency response of the output stage; and
  the integrated circuit further comprising a digital processing circuit coupled to the front-end circuit, the digital processing circuit being configured to decode a digital representation of a signal provided by the front-end circuit into data.

13. The integrated circuit of claim 12 further comprising a second front-end circuit, the second front-end circuit having an input coupled to a second matching network and the second matching network is coupled to a second signal input, wherein the second signal input provides signals compliant to one or more communications standards, the second front-end circuit comprising:

a second amplifier coupled to the second matching network, the second amplifier to amplify a signal provided by the second matching network to a specified level; and
  a second mixer coupled to an output of the second amplifier, wherein the second mixer is configured to down convert the output of the second amplifier to an internal frequency signal.

14. The integrated circuit of claim 12, wherein the high Q conductive material is bond wire.

15. The integrated circuit of claim 12, wherein the signals provided by the signal input to the front-end circuit are grouped based upon a frequency band used by each communications standard present in the signals.

16. The integrated circuit of claim 12 further comprising a third front-end circuit, the third front-end circuit having an input coupled to a third matching network and the third matching network is coupled to a third signal input, wherein the third signal provides signals compliant to one or more communications standards, the third front-end circuit comprising:

a third amplifier coupled to the third matching network, the third amplifier to amplify a signal provided by the signal input to a specified level;
  an off-chip circuit coupled to the third amplifier, wherein the off-chip circuit is not integrated onto the integrated circuit, the off-chip circuit comprising:
    a fourth matching network coupled to the third amplifier, wherein the fourth matching network is configured to minimize signal loss due to impedance mismatch;
    a filter coupled to the fourth matching network, the filter is configured to separate signals located closely in frequency;
    a fifth matching network coupled to the filter, wherein the fifth matching network is configured to minimize signal loss due to impedance mismatch; and
  a third mixer coupled to the off-chip circuit, wherein the third mixer is integrated in the integrated circuit, wherein the third mixer is configured to down convert the output of the second amplifier to an internal frequency.

* * * * *